United States Patent
Kouno et al.

(10) Patent No.: US 9,711,663 B2
(45) Date of Patent: Jul. 18, 2017

(54) POWER GENERATING SYSTEM AND METHOD OF DESIGNING POWER GENERATING SYSTEM

(71) Applicant: Hitachi, Ltd., Tokyo (JP)

(72) Inventors: Toru Kouno, Tokyo (JP); Yuuichi Nagayama, Tokyo (JP); Masaaki Fujimori, Tokyo (JP); Tomoharu Nakamura, Tokyo (JP); Koki Morikawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 405 days.

(21) Appl. No.: 14/484,304

(22) Filed: Sep. 12, 2014

(65) Prior Publication Data

US 2015/0090312 A1    Apr. 2, 2015

(30) Foreign Application Priority Data

Sep. 27, 2013 (JP) .................................. 2013-201847

(51) Int. Cl.
*H01L 31/00* (2006.01)
*G06F 17/50* (2006.01)
(Continued)

(52) U.S. Cl.
CPC ........ *H01L 31/02008* (2013.01); *G06F 17/50* (2013.01); *G06F 17/5068* (2013.01); *H02S 10/00* (2013.01); *Y02E 10/50* (2013.01)

(58) Field of Classification Search
CPC ............... H01L 31/02008; H02S 10/00; G06F 17/5068; G06F 17/50; Y02E 10/50
See application file for complete search history.

(56) References Cited

U.S. PATENT DOCUMENTS

2010/0253151 A1* 10/2010 Gerhardinger ............ G05F 1/67
307/82
2010/0295383 A1* 11/2010 Cummings ....... H01L 31/02021
307/151

(Continued)

FOREIGN PATENT DOCUMENTS

JP    2012-256092    12/2012

OTHER PUBLICATIONS

STIC Search Report.*

*Primary Examiner* — Jared Fureman
*Assistant Examiner* — James Evans
(74) *Attorney, Agent, or Firm* — Baker Botts L.L.P.

(57) ABSTRACT

A power generating system comprising: a plurality of power generating units coupled in parallel; a power collecting device for collecting electric power output from the plurality of power generating units; and wirings for coupling the plurality of power generating units and the power collecting device. A ratio of a conductor diameter to a predetermined length of each of the wirings is defined as a reference ratio. A value obtained by multiplying the reference ratio, a number of the wirings, and a loss generated by a specific wiring together is subtracted from a value obtained by multiplying a predetermined number of wirings for adjustment by a ratio of a conductor diameter to a length of the specific wiring. A total of the ratios of the conductor diameters to the lengths of the predetermined number of the wirings for adjustment is determined as a value less than the subtracted value.

6 Claims, 9 Drawing Sheets

(51) Int. Cl.
*H01L 31/02* (2006.01)
*H02S 10/00* (2014.01)

(56) References Cited

U.S. PATENT DOCUMENTS

| | | | |
|---|---|---|---|
| 2011/0031814 A1* | 2/2011 | Giesler | H02J 13/0082 307/77 |
| 2013/0037077 A1* | 2/2013 | Zhang | H01L 31/042 136/244 |
| 2013/0269746 A1* | 10/2013 | Ramsey | H01L 31/05 136/244 |
| 2014/0005845 A1* | 1/2014 | Thomas | H02J 3/385 700/291 |

* cited by examiner

POWER GENERATING SYSTEM AND METHOD OF DESIGNING POWER GENERATING SYSTEM

CLAIM OF PRIORITY

The present application claims priority from Japanese patent application JP 2013-201847 filed on Sep. 27, 2013, the content of which is hereby incorporated by reference into this application.

BACKGROUND OF THE INVENTION

This invention relates to a power generating system and a method of designing the power generating system.

In general, in a photovoltaic power generating system, a plurality of solar cell strings which are formed by coupling a plurality of solar cell modules in series are coupled in parallel in a coupling box, to thereby form a power generating unit. In addition, a plurality of power generating units are coupled in parallel by a power collection rack, and are controlled by a power conditioner so as to be supplied to a system.

Distances between the solar cell strings and the coupling box, and distances between the coupling boxes and the power collection rack are different from one another depending on an installation place of the power collection rack and installation places of the coupling boxes. For this reason, when the coupling is made by using the same kind of electric wire, resistance values of the electric wires are different from one another depending on differences in distance.

In JP 2012-256092 A, which is the background art of this technical field, there is disclosed a photovoltaic power generating system in which a plurality of solar cell generation units are coupled in parallel, and a part or all of total cable lengths of extension cables from the solar cell generation units to the parallel coupling points differ. In this case, the electric resistance values of power transmission paths from the solar cell generation units to the parallel coupling points are controlled to be approximately the same by using a plurality of kinds of extension cables which are different in at least one of an electric resistivity and a conductor cross section.

In addition, the JIS Standard (JIS C 8907) recommends that a loss (array circuit correction coefficient) of a coupling line that is a loss in a DC circuit part including an electric wire and a diode provided within a coupling box are each suppressed within 3%.

SUMMARY OF THE INVENTION

The loss in the DC circuit of the large-scaled photovoltaic power generating site is generated by a wiring resistance between the solar cell string and the coupling box, a backflow preventing diode within the coupling box, and a wiring resistance between the coupling box and the power collection rack. The JIS Standard (JIS C 8907) recommends that a sum of those losses (array circuit correction coefficient) is controlled within 3.0%.

For example, when the loss by the backflow preventing diode within the coupling box is 1.0%, the design can be made such that the wiring resistance between the solar cell string and the coupling box is suppressed within 1.0%, and the wiring resistance between the coupling box and the power collection rack is suppressed within 1.0%. For this reason, the construction needs to be carried out by changing a thickness of the wiring such that voltage drop determined by multiplying a rated current from the solar cell by the wiring resistance is suppressed within 1.0% depending on the distances from the solar cell string to the coupling box, and the distances from the coupling boxes to the power collection rack. Specifically, a wiring having a large diameter is used as the wiring having the long distances from the solar cells to the coupling box, and from the coupling boxes to the power collection rack. In addition, when the technology described in JP 2012-256092 A is applied, the wiring resistance values are made uniform by using the electric wires having different electric resistivities or conductor diameters. In any case, the large conductor diameter of the electric wire, the low electric resistivity of the electric wire, and the long electric wire involve a problem in that the cost of the electric wire increases.

It is therefore an object of this invention to provide a power generating system in which, with regard to a design of a wiring in a large-scaled power generating system, a thickness of a wiring having a long distance from a solar cell string to a coupling box, and a thickness of a wiring having a long distance from the coupling box to a power collection rack are each reduced within the necessary limit, and provide a method of designing the same.

The representative one of inventions disclosed in this application is outlined as follows. There is provided a power generating system comprising: a plurality of power generating units coupled in parallel; a power collecting device for collecting electric power output from the plurality of power generating units; and wirings for coupling the plurality of power generating units and the power collecting device. A ratio of a conductor diameter to a predetermined length of each of the wirings is defined as a reference ratio. A value obtained by multiplying the reference ratio, a number of the wirings, and a loss generated by a specific wiring together is subtracted from a value obtained by multiplying a predetermined number of wirings for adjustment by a ratio of a conductor diameter to a length of the specific wiring. A total of the ratios of the conductor diameters to the lengths of the predetermined number of the wirings for adjustment is determined as a value less than the subtracted value.

As set forth hereinabove, according to one representative embodiment of this invention, the electric wire having the suitable thickness can be selected depending on the length of the wiring which extends from the solar cell string, and hence the increase in cost of the electric wire can be suppressed. Problems, configurations, and effects other than those described above are made clear from a description of the following embodiments.

BRIEF DESCRIPTION OF THE DRAWINGS

The present invention can be appreciated by the description which follows in conjunction with the following figures, wherein.

DETAILED DESCRIPTION OF THE PREFERRED EMBODIMENTS

<First Embodiment>

Figure 1:
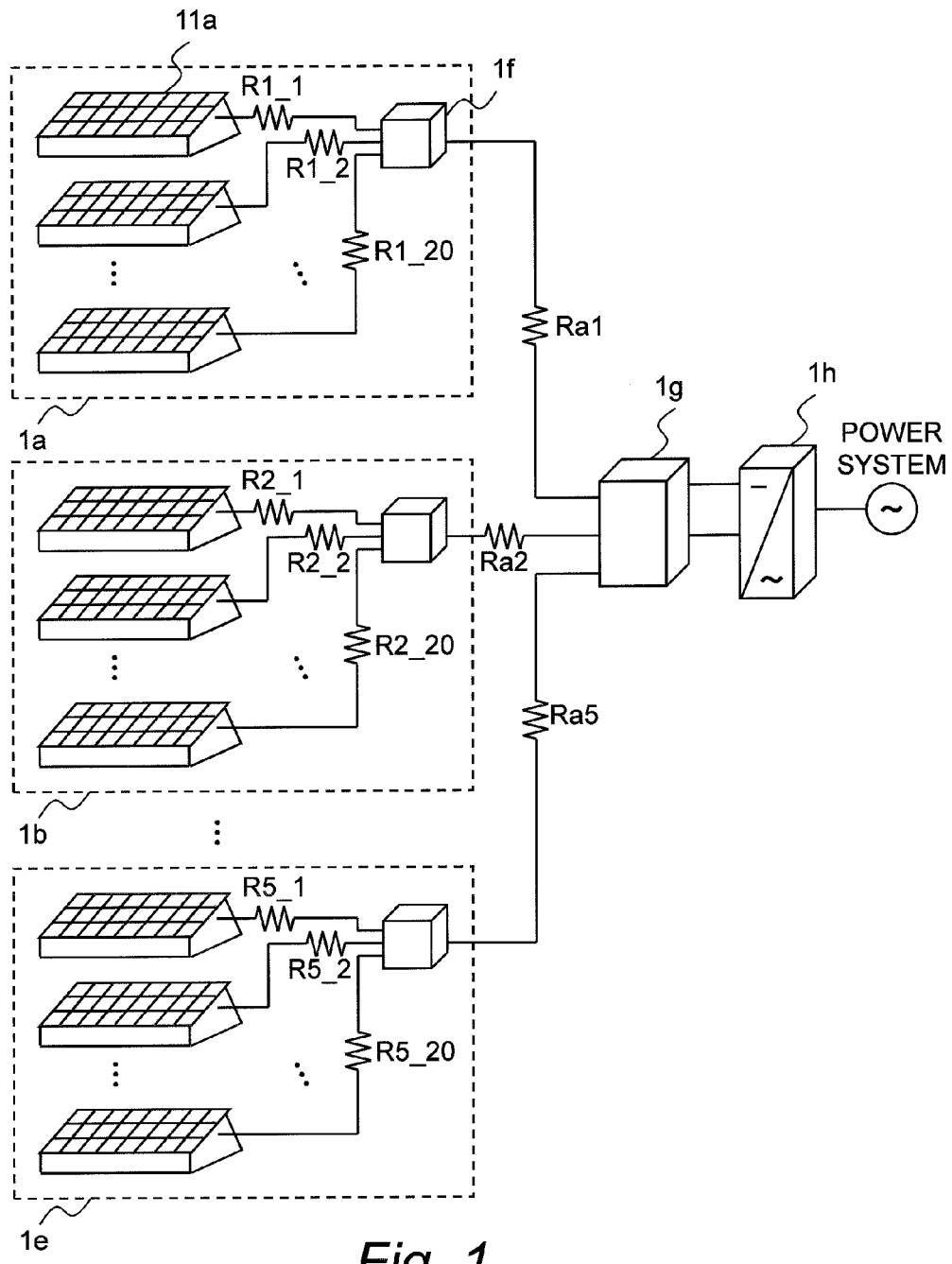
FIG. 1 is a diagram illustrating a configuration of a photovoltaic power generating system according to a first embodiment of this invention.

FIG. 1 is a diagram illustrating a configuration of a photovoltaic power generating system according to a first embodiment of this invention.

The photovoltaic power generating system according to the first embodiment of this invention includes a solar cell string (power generating unit) 11a which is formed by coupling a plurality of solar cell modules in series. The plurality of solar cell strings 11a are coupled in parallel in a coupling box 1f, to thereby form power generating units (solar cell array) 1a, 1b, . . . , 1e. Wirings between the solar cell strings 11a and the coupling box 1f have resistances R1_1, R1_2, . . . , R1_20. Likewise, wirings between the solar cell strings and the coupling box 1f of other power generating units also have resistances R2_1, R2_2, . . . , R2_20, . . . , R5_1, R5_2, . . . , R5_20. Lengths of these wirings are determined depending on installation places of the solar cell strings 11a, and installation places of the coupling boxes 1f, and hence resistance values of the wirings are different from one another.

A plurality of power generating units 1a, 1b, . . . , 1e are coupled in parallel by a power collection rack 1g. Wirings from the power generating units 1a, 1b, . . . , 1e to the power collection rack 1g have resistances Ra1, Ra2, . . . , Ra5, respectively. Lengths of these wirings are determined depending on the installation places of the coupling boxes 1f, and an installation place of the power collection rack 1g, and hence resistance values of the wirings are different from one another.

Electric power collected in the power collection rack 1g is controlled by a power conditioner 1h to be supplied to a system. The power conditioner 1h has a maximum power point tracking (MPPT) function, and a DC/AC converter (inverter) function.

Next, a description is given of a current flowing through the solar cell string 11a of the photovoltaic power generating system of the first embodiment.

Figure 2:
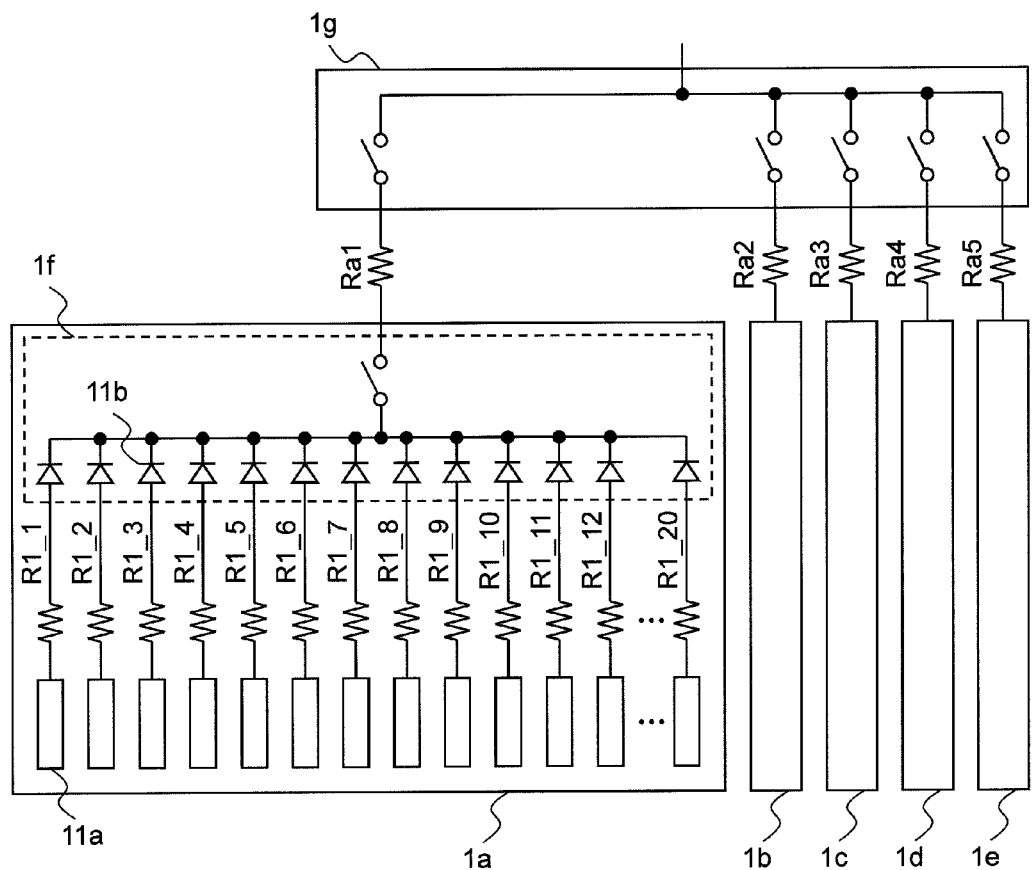
FIG. 2 is a diagram illustrating connections of a solar cell string, a coupling box and a power collection rack of the photovoltaic power generating system according to the first embodiment.

FIG. 2 is a diagram illustrating connections of the solar cell string 11a, the coupling box 1f, and the power collection rack 1g of the photovoltaic power generating system according to the first embodiment.

A plurality of solar cell modules are coupled in series, to thereby form the solar cell string 11a. In the coupling box 1f, the plurality of solar cell strings 11a are coupled in parallel through backflow preventing diodes 11b. Resistance values of the wirings between the solar cell strings 11a and the coupling box 1f are determined depending on the installation places of the solar cell strings 11a, and the installation place of the coupling box 1f. For this reason, the resistance values of the wiring resistances R1_1, R1_2, R1_3, R1_4, . . . , R1_20 are different from one another. Further, resistance values of wiring resistances between the coupling boxes 1f and the power collection rack 1g are determined depending on the installation places of the coupling boxes 1f, and the installation place of the power collection rack 1g. For this reason, the resistance values of the wiring resistances Ra1, Ra2, . . . , Ra5 are different from one another.

Figure 3:
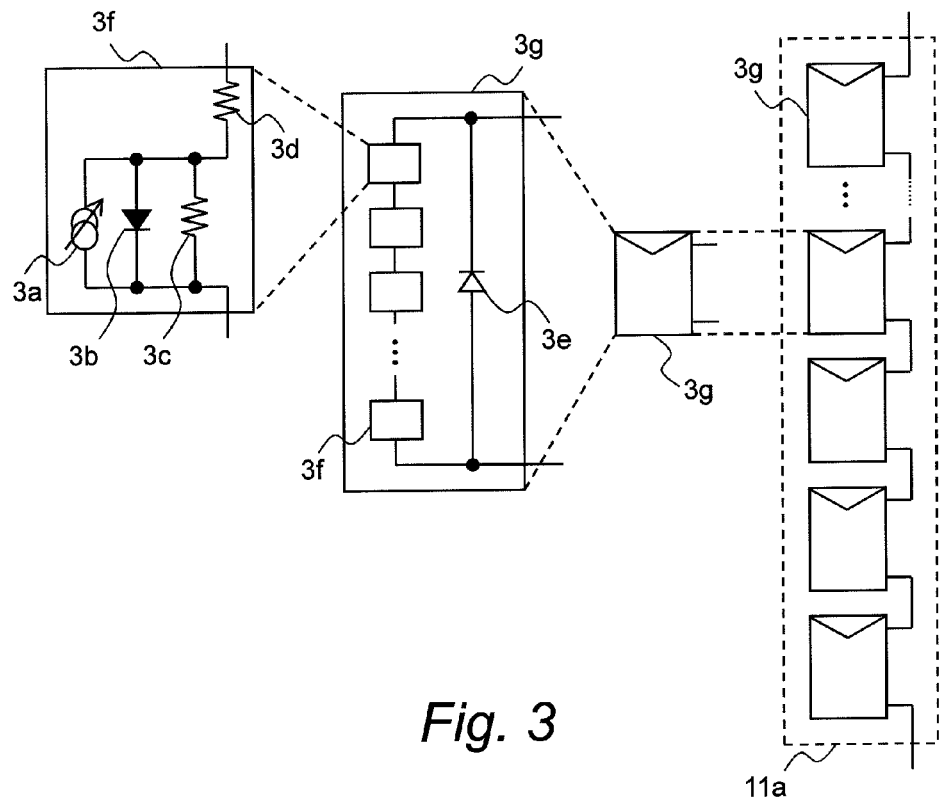
FIG. 3 is a diagram illustrating configurations of a solar cell, a solar cell module and the solar cell string according to the first embodiment.

FIG. 3 is a diagram illustrating configurations of a solar cell 3f, a solar cell module 3g, and the solar cell string 11a of the first embodiment.

In the solar cell module 3g, a plurality of solar cells 3f are coupled in series. The plurality of solar cells 3f coupled in series are partitioned by a bypass diode 3e. The bypass diode 3e is mounted to the solar cell module 3g in order to prevent a reverse current from flowing through the solar cells 3f when a reverse bias voltage is applied to the solar cell module 3g. Further, a plurality of solar cell modules 3g are coupled in series, to thereby form the solar cell string 11a. The solar cell 3f can be expressed in the form of an equivalent circuit including a current source 3a, a pn junction diode 3b, a shunt resistor 3c, and a series resistor 3d. The current source 3a outputs a current proportional to an amount of solar radiation.

Figure 4:
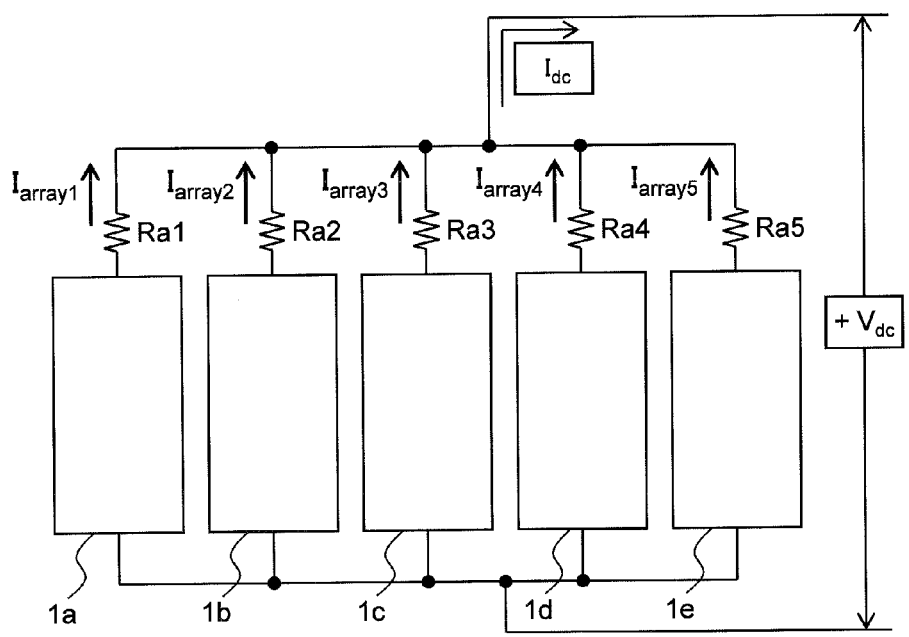
FIG. 4 is a diagram illustrating currents flowing from power generating units to the power collection rack according to the first embodiment.
Figure 5:
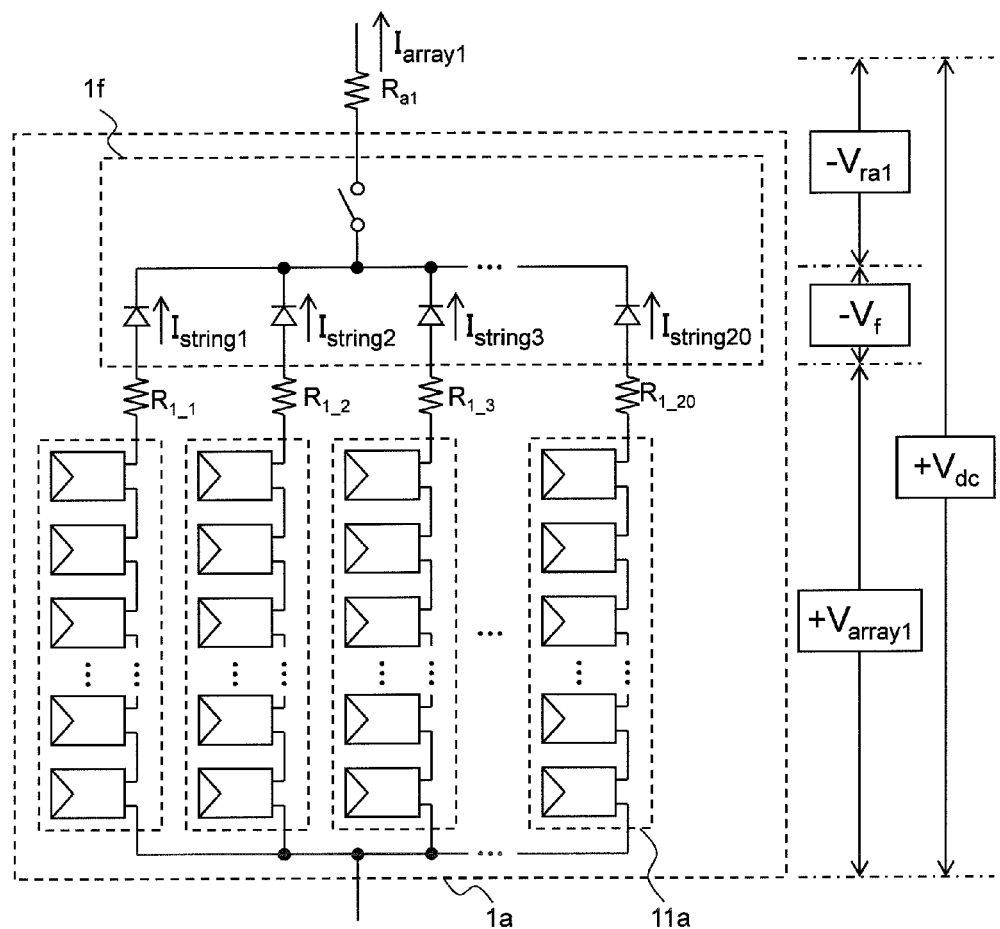
FIG. 5 is a diagram illustrating voltage drop across resistance of a wiring of the power generating unit according to the first embodiment.
Figure 6:
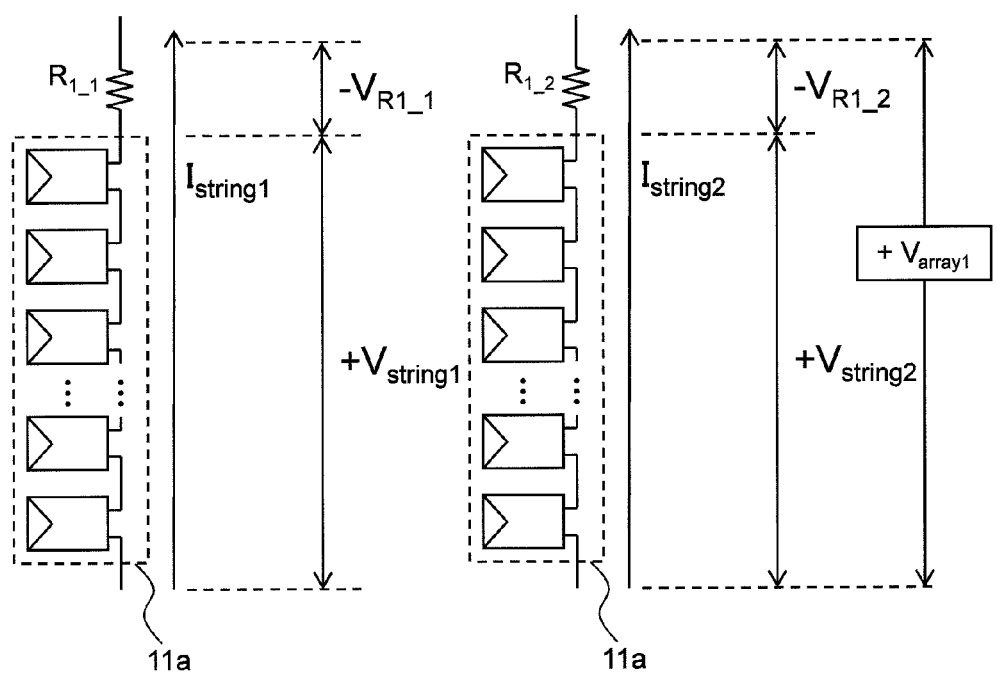
FIG. 6 is a diagram illustrating a voltage and a current in the solar cell string provided in the power generating unit of the first embodiment.

FIG. 4 is a diagram illustrating currents flowing from the power generating units 1a, 1b, . . . , 1e to the power collection rack 1g. FIG. 5 is a diagram illustrating voltage drop across the resistance of the wiring of the power generating unit 1a. In addition, FIG. 6 is a diagram illustrating a voltage and a current in the solar cell string 11a provided in the power generating unit 1a.

When an operating current of the entire photovoltaic power generating system is Idc, and an operating voltage of the entire photovoltaic power generating system controlled by the power conditioner is Vdc, as illustrated in FIG. 4, the operating current Idc of the entire photovoltaic power generating system is expressed by a sum of the currents which are caused to flow from the power generating units 1a, 1b, . . . , 1e to the power collection rack 1g.

$$Idc = I_{array1} + I_{array2} + I_{array3} + I_{array4} + I_{array5} \qquad (1)$$

When, as illustrated in FIG. 5, for the power generating unit 1a, the voltage drop developed by the resistance of the wiring from the coupling box 1f to the power collection rack 1g is −Vra1, and voltage drop developed across the backflow preventing diode 11b is −Vf, an operating voltage Varray1 of the power generating unit (solar cell array) 1a can be expressed by Expression (2).

$$Varray1 - Vra1 - Vf = Vdc \qquad (2)$$

Moreover, a solar cell array current Iarray1 can be expressed by a sum of currents which are caused to flow from the solar cell strings 11a to the coupling box 1f.

$$Iarray1 = Istring1 + Istring2 + Istring3 + Istring4 + \ldots + Istring20 \qquad (3)$$

In addition, as illustrated in FIG. 6, the voltage Varray1 applied one array is common to all the arrays, and hence when it is taken into consideration that a resistance value of the shunt resistor 3c is sufficiently large, a voltage Varray1 applied to the solar cell string 11a can be expressed by Expression (4) by using the solar cell array current Istring1.

$$V_{array1} = N_{cell} \cdot \left( \frac{n_f \cdot k \cdot T}{q} \ln\left( \frac{I_{sc} - I_{string1}}{I_s} \right) \right) - V_{R1\_1} \quad (4)$$

$$= N_{cell} \cdot \left( \frac{n_f \cdot k \cdot T}{q} \ln\left( \frac{I_{sc} - I_{string1}}{I_s} \right) \right) - I_{string1} \cdot R_{1\_1}$$

In Expression (4), Ncell is the number of solar cells constructing the solar cell string 11a, Is is a reverse saturated current [A], Isc is a short-circuit current [A], T is a solar cell element absolute temperature [K], k is the Boltzmann constant [J/K], q is a charge amount [C] of an electron, and of is a junction constant.

Likewise, the voltage Varray1 applied to another solar cell string 11a coupled in parallel to the solar cell string 11a can be expressed by Expression (5) by using a current Istring2 flowing through the solar cell string 11a.

$$V_{array1} = N_{cell} \cdot \left( \frac{n_f \cdot k \cdot T}{q} \ln\left( \frac{I_{sc} - I_{string2}}{I_s} \right) \right) - I_{string2} \cdot R_{1\_2} \quad (5)$$

Summarizing Expression (4) and Expression (5), it is understood that the current Istring2 is expressed in terms of the current Istring1. This relationship holds about all the solar cell strings as well which are coupled in parallel with one another. In other words, if the current Istring1 flowing through the first solar cell string is determined, then, currents flowing through other solar cell strings, respectively, can also be determined. When the currents Istring flowing through other solar cell strings, respectively, are expressed as functions of the current Istring1 flowing through the first solar cell string, in other words, in the form of Istring2=I2 [Istring1], Istring3=I3 [Istring1], Istring20=I20 [Istring1], as shown in Expression (6), the array current Iarray1 can be expressed as the function of Istring1.

$$Iarray1 = Istring1 + I2[Istring1] + I3[Istring1] + \ldots + I20[Istring1] \quad (6)$$

With regard to the array currents Iarray1 and Iarray2 as well, because the operating voltage Vdc is common to all the arrays, the relationship similar to Expression (4) and Expression (5) holds. For this reason, each of Iarray2 to Iarray5 can be expressed as the function of the array current Istring1.

For simplification, the case is considered where the whole voltage drop is suppressed to be less than 2.0% in consideration of only the voltage drop resulting from the resistances of the wirings from the solar cell strings to the coupling box, in other words, a method of ensuring the rated power Po shown in Expression (7).

$$V_{array1} \cdot I_{array1} > 0.98 \cdot P_o \quad (7)$$

Specifically, first of all, by using Expression (4), the current Istring1 as the reference is determined, and the voltage Varray with which the solar cell string is desired to be operated is obtained. Here, if a loss of the string 1 is 4.0%, then, Expression (8) holds and the voltage Varray can be expressed by Expression (9) transformed from Expression (8).

$$V_{array1} = \frac{1}{0.96} \cdot \left( N_{cell} \cdot \left( \frac{n_f \cdot k \cdot T}{q} \ln\left( \frac{I_{sc} - I_{string1}}{I_s} \right) \right) - I_{string1} \cdot R_{1\_1} \right) > \quad (8)$$

$$0.98 \cdot \left( \frac{P_o}{I_{array1}} \right)$$

-continued $$N_{cell} \cdot \left( \frac{n_f \cdot k \cdot T}{q} \ln\left( \frac{I_{sc} - I_{string1}}{I_s} \right) \right) - I_{string1} \cdot R_{1\_1} > 0.98 \cdot \left( \frac{P_o}{I_{array}} \right) \cdot 0.96 \quad (9)$$

At this time, the same current as that for the first solar cell string flows through each of (n−1) strings in the power generating unit 1a. In this case, in order that the loss of the electric power obtained from the n strings including the first solar cell string may become less than 2%, Expression (10) needs to hold.

$$n \cdot N_{cell} \cdot \left( \frac{n_f \cdot k \cdot T}{q} \ln\left( \frac{I_{sc} - I_{string1}}{I_s} \right) \right) - \quad (10)$$

$$\frac{I_{string1} \cdot (R_{1\_1} + \ldots + R_{1\_n})}{n} > 0.98 \cdot \left( \frac{P_o}{I_{array1}} \right)$$

It should be noted that it is desired that the power loss of less than 2% be set as a design target with a margin so that the power loss becomes equal to or less than 3% regulated in the JIS Standard described above.

Further, when Expression (9) is multiplied by n, and is then subtracted from Expression (10), resulting Expression (9) can be transformed into Expression (11).

$$(n-1) \cdot I_{string1} \cdot R_{1\_1} - I_{string1} \cdot (R_{1\_2} + \ldots + R_{1\_n}) > \quad (11)$$

$$n \cdot 0.98 \cdot \left( \frac{P_o}{I_{array1}} \right) \cdot (1 - 0.96)$$

If Varray1=0.98×Po/Iarray1 is set as the design target as shown in Expression (7), then, Varray1/Istring1 becomes a rated resistance value Rt of the solar cell string. When this rated resistance value Rt is used, Expression (12) can be substituted for Expression (11).

$$(R_{1\_2} + \ldots + R_{1\_n}) < (n-1) \cdot R_{1\_1} - n \cdot (1 - 0.96) \cdot Rt \quad (12)$$

In other words, it is only necessary that the sum of the wiring resistance values of other (n−1) strings in the power generating unit 1a is set so as to meet Expression (12). The electric resistivities ρ of all the cables are equal to one another, wiring lengths of the cables are L1_1, L1_2, ..., L1_n, conductor diameters of the cables are S1_1, S1_2, ..., S1_n, a wiring length of the cable necessary for the power loss to be less than 2% is Lt, and a conductor diameter (in cross section of the conductor) of the cable is St. Under this condition, the wiring resistance of the first solar cell string can be expressed in the form of ρ×(L1−1/S1−1). For this reason, Expression (13) can be substituted for Expression (12).

$$\left( \frac{L_{1\_2}}{S_{1\_2}} + \frac{L_{1\_3}}{S_{1\_3}} + \ldots + \frac{L_{1\_n}}{S_{1\_n}} \right) < (n-1) \cdot \frac{L_{1\_1}}{S_{1\_1}} - n \cdot (1 - 0.96) \cdot \frac{L_t}{S_t} \quad (13)$$

Next, a description is given of an example of the concrete resistance value of the wiring in the photovoltaic power generating system of the first embodiment.

In the photovoltaic power generating system of the first embodiment, a concrete example is described in which when, by using two solar cell strings, the voltage drop in one solar cell string becomes, for example, 4%, in order to compensate for this loss, the voltage drop in the other solar cell string is calculated, and the wiring of the solar cell string having the long distance to the coupling box 1f is set to have a suitable thickness.

Figure 7:
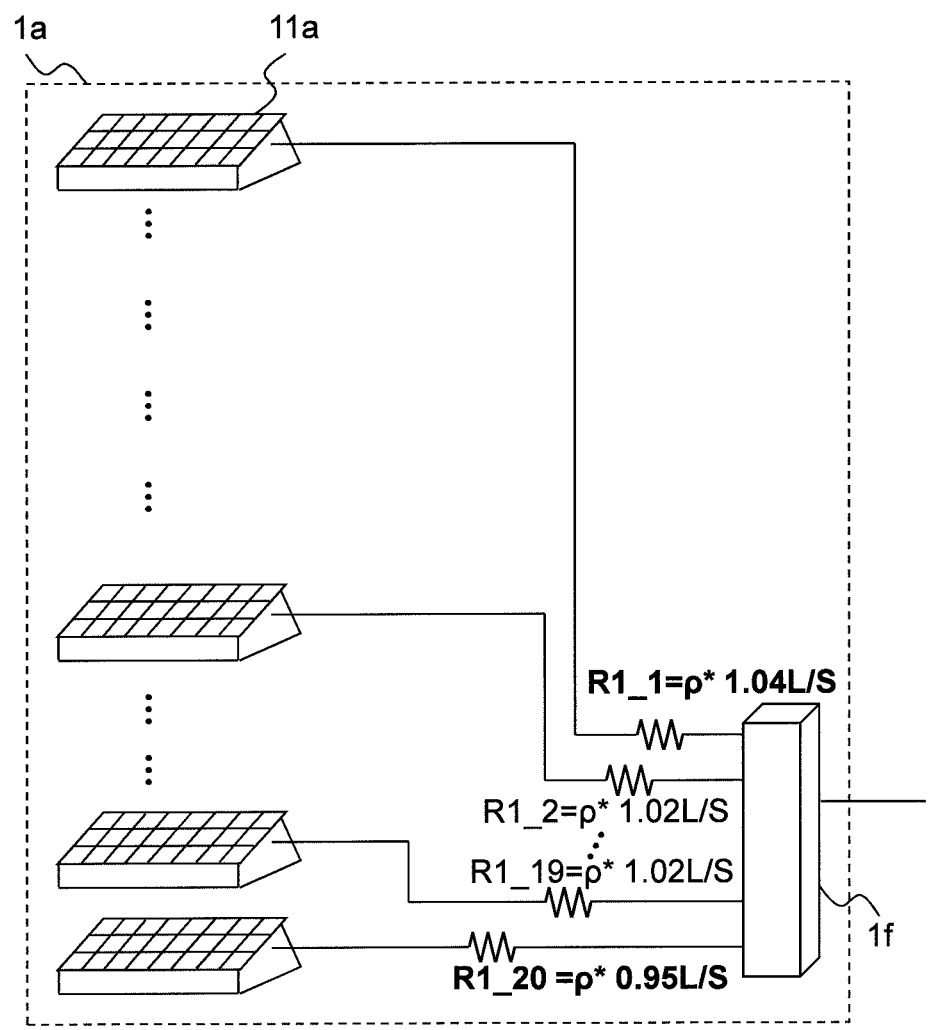
FIG. 7 is a diagram illustrating a configuration of the photovoltaic power generating system according to the first embodiment.

FIG. 7 is a diagram illustrating the configuration of the photovoltaic power generating system of the first embodiment, and indicates a relationship between the length and the conductor diameter of the wiring extending from the solar cell string 11a coupled to the coupling box 1f. In the example of the configuration of the photovoltaic power generating system illustrated in FIG. 7, the resistance value of the wiring is calculated by using Expression (13) described above.

The concrete example illustrated in FIG. 7 indicates the relationship between the lengths and the conductor diameters of 20 solar cell strings constructing the power generating unit 1a. The rated resistance of the solar cell string is Rt, a loss of the wiring resistance R1_1 of the first solar cell string farthest from the coupling box 1f is 4.0%, and losses of the wiring resistances R1_2, R1_3, ..., R1_20 of the solar cell strings of the second to 20-th solar cell strings are each 2.0%. When the rated resistance L/S set as the reference is used, the loss of 4.0% of the wiring resistance R1_1 can be expressed as 1.04L/S, and the loss of 2.0% of each of the wiring resistances R1_2, R1_3, ..., R1_20 can be expressed as 1.02L/S. In the case where the whole voltage drop is desired to be suppressed to be less than 2.0% by using the 20-th solar cell string, when n=2 is substituted into Expression (13), Expression (14) can be substituted for Expression (13).

$$\left(\frac{L_{R1\_20}}{S_{R1\_20}}\right) < \frac{1.04 \cdot L}{S} - 2 \cdot (1 - 0.96) \cdot \frac{L}{S} = 0.96 \cdot \frac{L}{S} \quad (14)$$

It is understood from Expression (14) that in the photovoltaic power generating system of the first embodiment, it is only necessary that the wiring resistance value of the 20-th solar cell string is set less than ρ×0.96×(L/S).

In the manner as described above, in the first embodiment, the suitable thickness of the wiring between the solar cell string 11a and the coupling box 1f in the photovoltaic power generating system can be calculated. In addition, even when the wiring between the solar cell string 11a and the coupling box 1f is long, the wiring can have the suitable thickness. In addition, as described in the first embodiment, the solar cell string for compensating for the wiring resistance is selected on a one-to-one basis. In this way, the number of solar cell strings subjected to the influence can be reduced, and thus the design work can be simplified.

<Second Embodiment>

Next, a description is given of a photovoltaic power generating system according to a second embodiment of this invention.

In the photovoltaic power generating system of the second embodiment, a concrete example is described in which, when the voltage drop in one solar cell string becomes, for example, 4%, in order to compensate for this loss by using all the solar cell strings, the voltage drop in all the 20 solar cell strings constructing the power generating unit 1a is calculated, and the wiring of the solar cell string having the long distance to the coupling box 1f is set to have the suitable thickness.

It should be noted that in the second embodiment, Expression (13) in the first embodiment is used as the expression used to calculate the concrete resistance value of the wiring.

Figure 8:
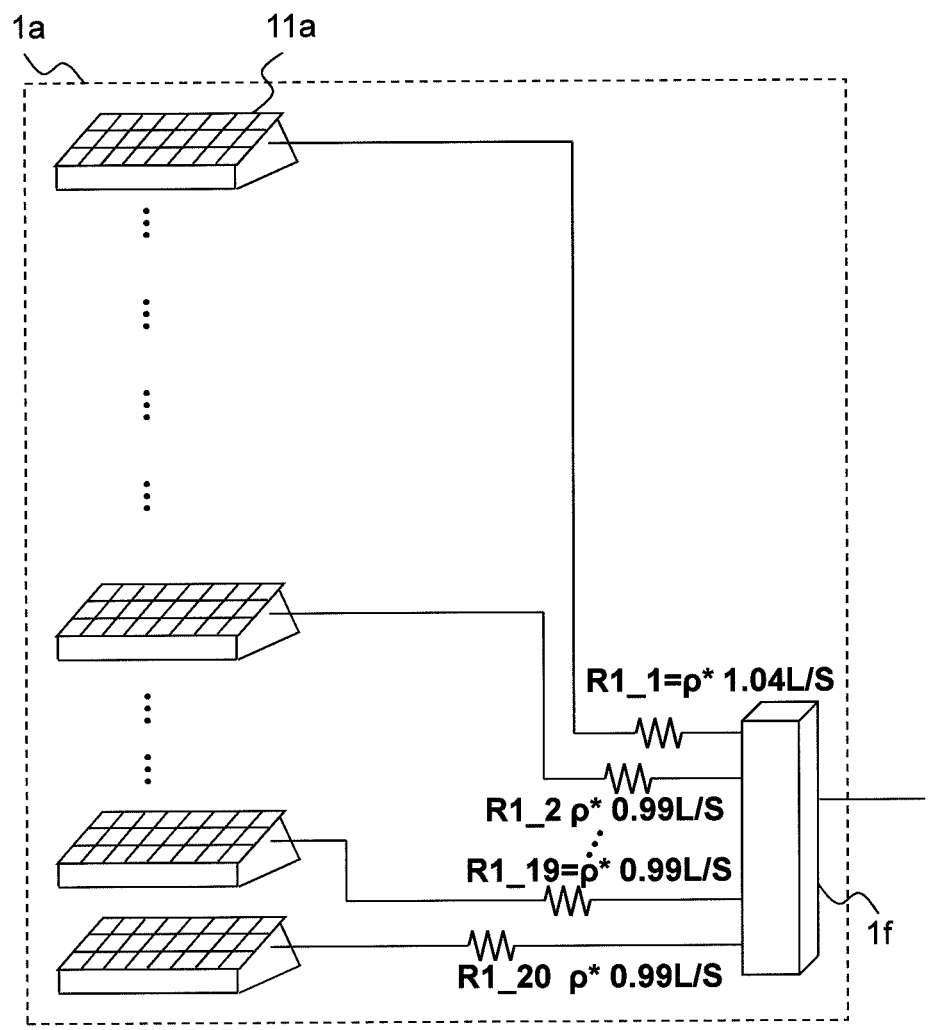
FIG. 8 is a diagram illustrating a configuration of a photovoltaic power generating system of a second embodiment of this invention.

FIG. 8 is a diagram illustrating the configuration of the photovoltaic power generating system of the second embodiment, and indicates the relationship between the length and the conductor diameter of the wiring extending from the solar cell string 11a coupled to the coupling box 1f. In the example of the configuration of the photovoltaic power generating system illustrated in FIG. 8, the resistance value of the wiring is calculated by using the same expression as Expression (13) in the first embodiment.

The loss of the wiring resistance R1_1 of the first solar cell string farthest from the coupling box 1f is 4.0%. In the case where the whole voltage drop is desired to be suppressed to be less than 2.0% by using the second to 20-th solar cell strings, when n=20 is substituted into Expression (13), Expression (15) can be substituted for Expression (13). When the length and the conductor diameter of the wiring resistance are determined in Expression (15), the loss of the wiring resistance R1_1 of the first solar cell string can be compensated for.

$$\left(\frac{L_{R1\_2}}{S_{R1\_2}} + \frac{L_{R1\_3}}{S_{R1\_3}} + \ldots + \frac{L_{R1\_20}}{S_{R1\_20}}\right) < \quad (15)$$
$$19 \cdot \frac{1.04 \cdot L}{S} - 20 \cdot (1 - 0.96) \cdot \frac{L}{S} = \frac{18.96 \cdot L}{S}$$

It is understood from Expression (15) that the sum of the wiring resistance values of the second to 20-th solar cell strings is less than ρ×(18.96L/S), and when the sum is divided equally into parts which are in turn allocated to other solar cell strings, it is only necessary that the wiring resistance value of each of the solar cell strings is set less than ρ×(0.997L/S).

In the manner as described above, in the second embodiment, the suitable thickness of the wiring between the solar cell string 11a and the coupling box 1f in the photovoltaic power generating system can be calculated. In addition, even when the wiring between the solar cell string 11a and the coupling box 1f is long, the wiring can have the suitable thickness. In addition, as described in the second embodiment, the wiring resistances are compensated for by all other solar cell strings. In this way, the suitable design can be made when one solar cell string is far set.

<Third Embodiment>

Next, a description is given of a photovoltaic power generating system according to a third embodiment of this invention.

In the photovoltaic power generating system of the third embodiment, a concrete example is described in which in order to compensate for the loss of the wiring between the coupling box 1f and the power collection rack 2g, the wiring of the coupling box 1f having the long distance to the power collection rack 1g is set to have the suitable thickness.

It should be noted that in the third embodiment, Expression (13) in the first embodiment is used as the expression used to calculate the concrete resistance value of the wiring.

Figure 9:
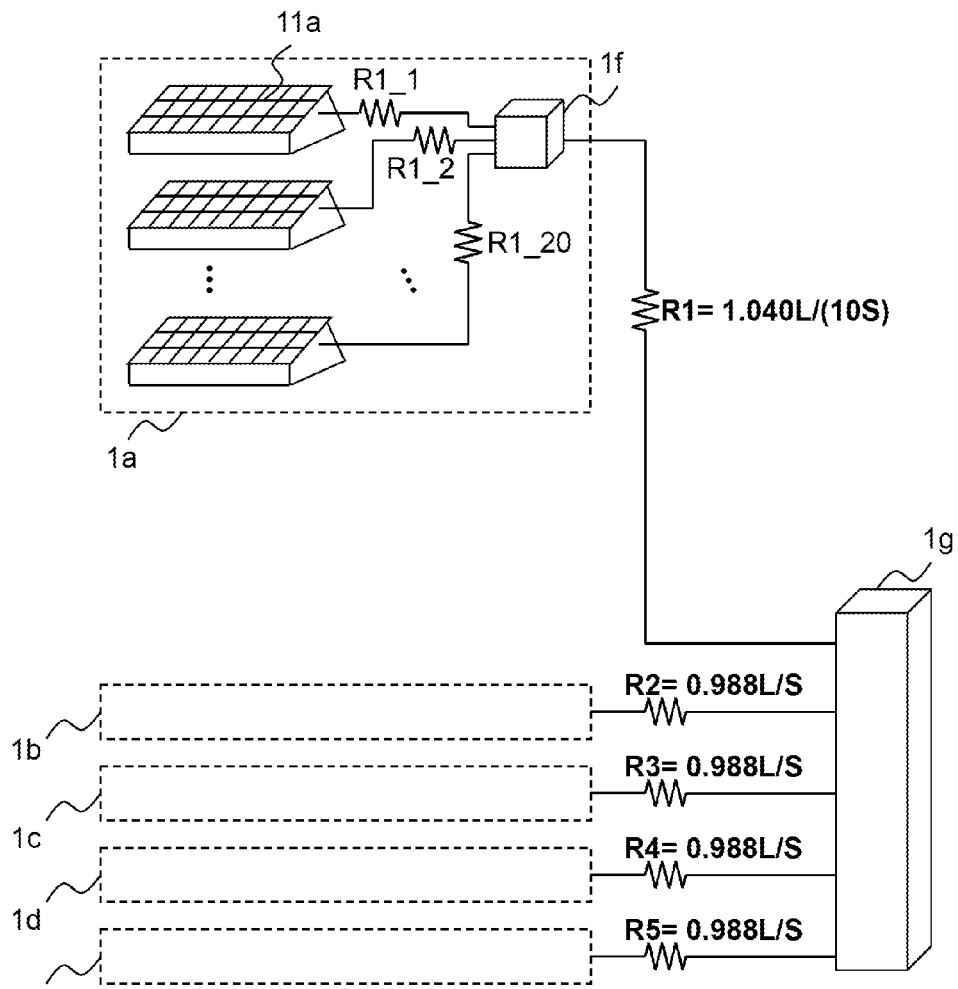
FIG. 9 is a diagram illustrating a configuration of a photovoltaic power generating system of a third embodiment of this invention.

FIG. 9 is a diagram illustrating the configuration of the photovoltaic power generating system of the third embodiment, and indicates a relationship between the lengths and the conductor diameters of the wirings extending from the power generating units 1a, 1b, 1c, 1d, and 1e which are coupled to the power collection rack 1g. In the example of the configuration of the photovoltaic power generating system illustrated in FIG. 9, the resistance value of the wiring is calculated by using the same expression as Expression (13) in the first embodiment described above.

The loss of the wiring resistance R1 of the first power generating unit farthest from the power collection rack 1g is 4.0%. In the case where the whole voltage drop is desired to be suppressed to be less than 2.0%, when n=5 is substituted into Expression (13), Expression (16) can be substituted for Expression (13). When in Expression (16), the length of the wiring resistance and the conductor diameter of the wiring resistance are set, the loss of the wiring resistance R1 of the first power generating unit can be compensated for.

$$\left(\frac{L_{R2}}{S_{R2}}\right) < 4 \cdot \frac{1.04 \cdot L}{10 \cdot S} - 5 \cdot (1 - 0.96) \cdot \frac{L}{10 \cdot S} = \frac{3.96 \cdot L}{10 \cdot S} \quad (16)$$

It is understood from Expression (16) that the sum of the wiring resistance values of the second to fifth power generating units is less than $\rho \times (3.96L/10S)$, and when the sum is divided equally into parts which are in turn allocated to the power generating units, it is only necessary that the wiring resistance value of each of the power generating units is set less than $\rho \times (0.99L/S)$.

In the manner as described above, in the third embodiment, the suitable thickness of the wiring between the coupling box 1f and the power collection rack 1g in the photovoltaic power generating system can be calculated. In addition, the long wiring between the coupling box 1f and the power collection rack 1g can be set to have the suitable thickness.

<Fourth Embodiment>

Next, a description is given of a calculating method (designing method), which uses a computer (design system) for calculating the thickness of the wiring of the photovoltaic power generating system by using the method which has been described so far, according to a fourth embodiment of this invention.

Figure 10:
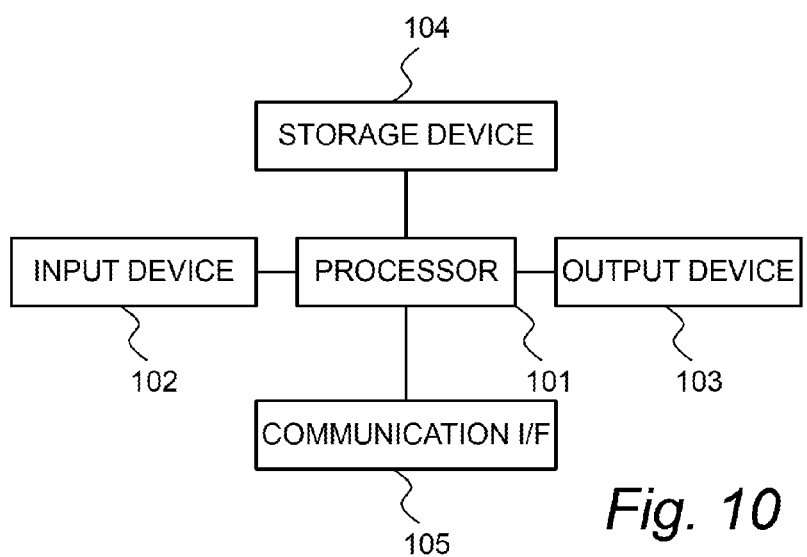
FIG. 10 is a block diagram illustrating a configuration of a computer according to a fourth embodiment of this invention.

FIG. 10 is a block diagram illustrating a hardware configuration of the computer for calculating the thickness of the wiring of the photovoltaic power generating system according to the fourth embodiment of this invention.

The computer in the fourth embodiment is a computer including a processor 101, an input device 102, an output device 103, a storage device 104, and a communication interface 105.

The processor 101 includes a CPU (central processing unit) for executing a program, a ROM as a nonvolatile storage element, and a RAM as a volatile storage element. The ROM stores therein an invariable program (for example, a BIOS) or the like. The RAM is a high-speed volatile storage element such as a dynamic random access memory (DRAM). In addition, the RAM temporarily stores therein the program stored in the storage device 104, and data to be used in executing the program.

The input device 102 is a keyboard, a mouse, or the like, and is an interface which receives an input from a user. The output device 103 is a display device, a printer, or the like, and outputs a calculation result in the form which can be visually recognized by the user.

The storage device 104 is, for example, a large-scaled nonvolatile storage device such as a magnetic storage device and a flash memory. In addition, the storage device 104 stores therein a program to be executed by the CPU of the processor 101, and data to be used in executing the program. In other words, the program is read out from the storage device 104 to be loaded into the RAM, and is executed by the CPU of the processor.

The communication interface 105 is a network interface device for controlling communication with another device in accordance with a predetermined protocol.

A program to be executed by the CPU of the processor 101 is provided for each of servers through a removable medium (such as a CD-ROM and a flash memory) or a network, and is then stored in a nonvolatile storage device as a non-temporary storage medium. For this reason, it is preferred that the computer system have an interface through which data is read from the removable medium.

The system in the fourth embodiment is a computer system which is physically configured on one computer or which is configured on a plurality of logical or physical computers. In addition, the system in the fourth embodiment may be operated in separate threads on the same computer, or may be operated on a virtual computer constructed on a plurality of physical computer resources.

Figure 11:
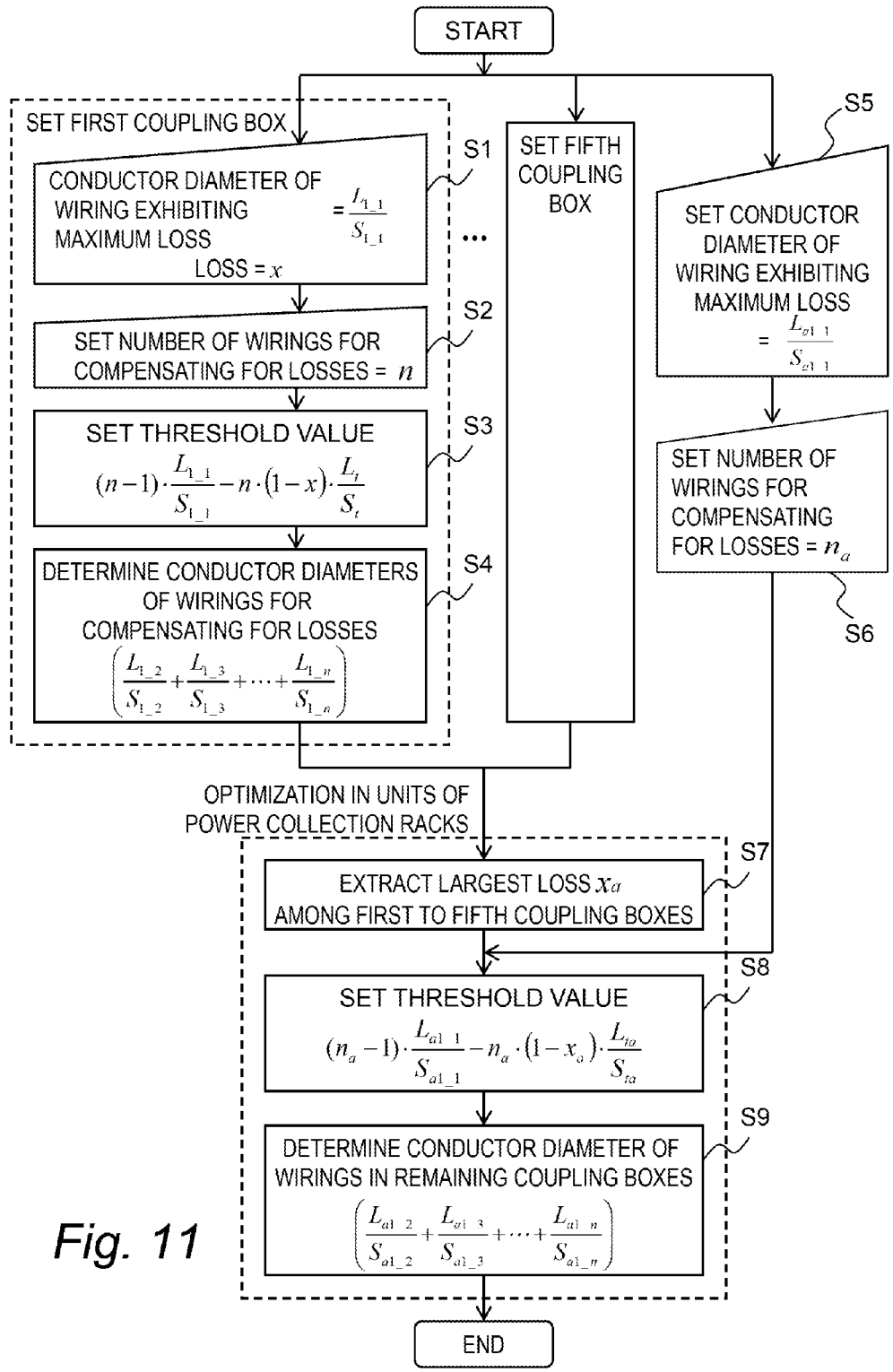
FIG. 11 is a flow chart illustrating a designing method according to the fourth embodiment.

FIG. 11 is a flow chart illustrating the designing method of calculating the thickness of the wiring of the photovoltaic power generating system according to the fourth embodiment of this invention.

Firstly, the conductor diameter $L1\_1/S1\_1$ of the wiring, which exhibits the largest loss, of the wirings coupled to the first coupling box, and the loss x of the wiring concerned are set (Step S1), and the number n of the wirings for compensating for the losses is set (Step S2). When a wiring length necessary for the loss of the electric power to become less than the target value is Lt, and the conductor diameter (in cross section of the conductor) of the cable is St, the calculation is carried out with the value of the right side of Expression (13) as a threshold value (Step S3). Then, the conductor diameters of the wirings for compensating for the losses are obtained in such a way that a sum of ratios of the conductor diameters to the wiring lengths does not exceed the threshold value calculated in Step S3 (Step S4). By executing the processing from Steps S1 to S4, the total loss by the wirings coupled to the first coupling box can be reduced to be less than the target value.

The processing from Steps S1 to S4 is executed for all the coupling boxes 1f.

In parallel with the processing from Steps S1 to S4, the conductor diameter $La1\_1/Sa1\_1$ of the wiring, which exhibits the largest loss, of the wirings between the coupling boxes 1f and the power collection rack 1g is set (Step S5), and the number na of wirings for compensating for the losses is set (Step S6).

After the calculation of the conductor diameters of the wirings has been completed for all the coupling boxes 1f, the wirings between the coupling boxes 1f and the power collection rack 1g are optimized.

First of all, the largest loss xa of the losses in the first to fifth coupling boxes is extracted from the results of the processing from Steps S1 to S4 (Step S7), and the calculation is carried out with the value of the right side of Expression (13) as the threshold value (Step S8). Then, the conductor diameters of the wirings for compensating for the losses are obtained in such a way that a sum of ratios of the conductor diameters to the wiring lengths does not exceed the threshold value calculated in Step S8 (Step S9).

This invention is not limited to the above-described embodiments but includes various modifications. The above-described embodiments are explained in details for better understanding of this invention and are not limited to those including all the configurations described above. A part of the configuration of one embodiment may be replaced with that of another embodiment; the configuration of one embodiment may be incorporated to the configuration of another embodiment. A part of the configuration of each embodiment may be added, deleted, or replaced by that of a different configuration.

The above-described configurations, functions, processing modules, and processing means, for all or a part of them, may be implemented by hardware: for example, by designing an integrated circuit. The above-described configurations and functions may be implemented by software, which means that a processor interprets and executes programs providing the functions.

The information of programs, tables, and files to implement the functions may be stored in a storage device such as a memory, a hard disk drive, or an SSD (Solid State Drive), or a storage medium such as an IC card, or an SD card.

The drawings shows control lines and information lines as considered necessary for explanation but do not show all control lines or information lines in the products. It can be considered that almost of all components are actually interconnected.

What is claimed is:

1. A power generating system comprising:
    a plurality of power generating units coupled in parallel;
    a power collecting device for collecting electric power output from the plurality of power generating units; and
    wiring for coupling the plurality of power generating units and the power collecting device,
    wherein a ratio of a conductor diameter to a predetermined length of each of the wirings is defined as a reference ratio,
    wherein a value obtained by multiplying the reference ratio, a number of the wirings, and a loss generated by a specific wiring together is subtracted from a value obtained by multiplying a predetermined number of wirings for adjustment by a ratio of a conductor diameter to a length of the specific wiring, and
    wherein a total of the ratios of the conductor diameters to the lengths of the predetermined number of the wirings for adjustment is determined as a value less than the subtracted value.

2. The power generating system according to claim 1, further comprising a coupling device provided between at least one of the plurality of power generating units and the power collecting device, the at least one of the plurality of power generating units being coupled to the coupling device
    wherein each of the wirings is included in any one of a first wiring group between the power collecting device and the coupling device and a second wiring group between the coupling device and the plurality of power generating units, and
    wherein the specific wiring and the wirings for adjustment are included in the first wiring group.

3. The power generating system according to claim 1, further comprising a coupling device provided between at least one of the plurality of power generating units and the power collecting device, the at least one of the plurality of power generating units being coupled to the coupling device,
    wherein each of the wirings is included in any one of a first wiring group between the power collecting device and the coupling device and a second wiring group between the coupling device and the plurality of power generating units, and
    wherein the specific wiring and the wirings for adjustment are included in the second wiring group.

4. A method of designing a power generating system including a plurality of power generating units coupled in parallel, a power collecting device for collecting electric power output from the plurality of power generating units, and wirings for coupling the plurality of power generating units and the power collecting device, the method comprising steps of:
    identifying, by a hardware processor, a reference ratio as a ratio of a conductor diameter to a predetermined length of each of the wirings;
    subtracting, by the hardware processor, a value obtained by multiplying the reference ratio, a number of the wirings, and a loss generated by a specific wiring together from a value obtained by multiplying a predetermined number of wirings for adjustment by a ratio of a conductor diameter to a length of the specific wiring;
    determining, by the hardware processor, a total of the ratios of the conductor diameters to the lengths of the predetermined number of the wirings so as to be less than the subtracted value;
    calculating, by the hardware processor, one or more parameters associated with the wirings for coupling the plurality of power generating units and the power collecting device based on the determined total of the ratios; and
    adjusting the wirings based on the calculated one or more parameters to achieve lower resistance and compensate for power losses.

5. The method of designing a power generating system according to claim 4,
    wherein the power generating system further includes a coupling device provided between at least one of the plurality of power generating units and the power collecting device, the at least one of the plurality of power generating units being coupled to the coupling device,
    wherein each of the wirings are included in any one of a first wiring group between the power collecting device and the coupling device and a second wiring group between the coupling device and the plurality of power generating units, and
    wherein the method further comprising a step of determining the specific wiring and the wirings for adjustment being included in the first wiring group.

6. The method of designing a power generating system according to claim 4,
    wherein the power generating system further comprises a coupling device provided between at least one of the plurality of power generating units and the power collecting device, the at least one of the plurality of power generating units being coupled to the coupling device,
    wherein the wirings are included in any one of a first wiring group between the power collecting device and the coupling device and a second wiring group between the coupling device and the plurality of power generating units, and
    wherein the method further comprising a step of determining the specific wiring and the wirings for adjustment being included in the second wiring group.

* * * * *